(12) United States Patent
Chang et al.

(10) Patent No.: US 8,860,433 B1
(45) Date of Patent: Oct. 14, 2014

(54) METHOD AND SYSTEM FOR SELF-CONTAINED TIMING AND JITTER MEASUREMENT

(75) Inventors: Victor A. Chang, San Jose, CA (US); Bozidar Krsnik, Simi Valley, CA (US)

(73) Assignee: Altera Corporation, San Jose, CA (US)

(*) Notice: Subject to any disclaimer, the term of this patent is extended or adjusted under 35 U.S.C. 154(b) by 129 days.

(21) Appl. No.: 13/563,529

(22) Filed: Jul. 31, 2012

(51) Int. Cl.
*G01R 23/20* (2006.01)
*H03D 3/24* (2006.01)
*G01M 1/10* (2006.01)

(52) U.S. Cl.
USPC .................. 324/620; 324/76.48; 375/376

(58) Field of Classification Search
CPC .... G01R 31/28; G01R 31/31709; H04L 1/25; H04L 7/00
USPC ........... 324/76.11–76.82, 102, 613, 620, 622, 324/712, 614; 375/226, 371, 359, 360, 376, 375/227, 228, 240.27, 254, 278, 284, 285, 375/296, 346, 367; 702/57–79, 106, 124, 702/125, 189, 190–197, 111
See application file for complete search history.

(56) References Cited

U.S. PATENT DOCUMENTS

| | | | | |
|---|---|---|---|---|
| 7,133,483 | B1* | 11/2006 | Kramer et al. ................ | 375/371 |
| 7,171,601 | B2* | 1/2007 | Frisch ........................... | 714/738 |
| 7,212,744 | B2* | 5/2007 | Shiramizu .................... | 398/154 |
| 7,453,255 | B2* | 11/2008 | Sunter et al. ................ | 324/76.48 |
| 8,243,867 | B2* | 8/2012 | Shin .............................. | 375/355 |
| 2005/0228294 | A1* | 10/2005 | Yamaki ........................ | 600/478 |
| 2006/0077082 | A1* | 4/2006 | Shanks et al. ................ | 341/120 |
| 2007/0157057 | A1* | 7/2007 | Hess et al. .................... | 714/724 |
| 2008/0013609 | A1* | 1/2008 | Daxer et al. .................. | 375/221 |
| 2008/0240328 | A1* | 10/2008 | Fukushima ................... | 375/376 |
| 2010/0201408 | A1* | 8/2010 | Burcea ......................... | 327/115 |
| 2011/0064178 | A1* | 3/2011 | Sweeney et al. .............. | 375/371 |

FOREIGN PATENT DOCUMENTS

WO    WO2007149212    * 12/2007  ............. G08B 13/14

OTHER PUBLICATIONS

Altera Corporation 2010. "AN 608: HST Jitter and BER Estimator Tool for Stratix IV GX and GT Devices," AN-608-1.0, pp. 1-17.

* cited by examiner

*Primary Examiner* — Tung X Nguyen
*Assistant Examiner* — Raul Rios Russo
(74) *Attorney, Agent, or Firm* — Weaver Austin Villeneuve & Sampson LLP

(57) ABSTRACT

Disclosed are systems, apparatus, and methods for a self-contained timing and jitter measurement. In various embodiments, a device may include a first clock signal generator operative to provide a first clock signal to a transmitter of a transceiver, where the first clock signal operates at a first frequency. The device may further include a second clock signal generator operative to provide a second clock signal to a receiver of the transceiver, where the second clock signal operates at a second frequency, and where the receiver samples an output of the transmitter at a sampling rate determined by the second frequency. In some embodiments, the device may further include a logic circuit operative to receive an output signal from the receiver and further operative to determine an indication of jitter based on the received output signal.

17 Claims, 6 Drawing Sheets

METHOD AND SYSTEM FOR SELF-CONTAINED TIMING AND JITTER MEASUREMENT

TECHNICAL FIELD

The present disclosure generally relates to integrated circuits. More specifically, the present disclosure relates to techniques and systems for measuring timing characteristics of an integrated circuit.

DESCRIPTION OF RELATED ART

A device, such as a programmable logic device (PLD) or an application specific integrated circuit (ASIC), may be a semiconductor integrated circuit that contains logic circuitry that can be designed to perform a host of logic functions. In a typical scenario, a designer uses computer-aided design (CAD) tools to design a custom logic circuit. These tools use information regarding the hardware capabilities of a given device to help the designer implement the custom logic circuit on that given device. In many instances, the device may exhibit timing characteristics, such as a delay, latency, or oscillation which may be referred to as jitter.

Conventional methods of measuring jitter may compare a signal obtained from the device with a reference signal generated based on a reference clock. The signal may be sliced, and edges of the signal may be aligned with ideal edges of the reference clock signal, as determined by a clock recovery circuit. A deviation of the signal from the reference signal may be measured by measuring a deviation between the edges. While comparison of the signals may provide a measurement of jitter, such measurements typically take 20 to 30 seconds to obtain. In a device such as a multi-channel transceiver, a jitter measurement may take 20-30 seconds per channel. Thus, a jitter measurement for a transceiver with 66 channels may take as long as 33 minutes. Such long measurement times preclude using conventional methods to measure jitter during the production process. Moreover, such methods may require costly external equipment. Consequently, devices are often untested when delivered to a customer or user of the device.

OVERVIEW

According to various embodiments, a device, such as a programmable logic device, may be configured to measure timing characteristics of an integrated circuit. In some embodiments, a timing characteristic may refer to a delay, latency, or oscillation in a circuits behavior, such as jitter. In various embodiments, the integrated circuit may be part of a transceiver. In particular embodiments, the device may be used to measure jitter or another timing measurement for the transceiver. According to various embodiments, reprogrammable logic or hard logic within the transceiver may be programmed or configured to measure timing characteristics of the transceiver.

In various embodiments, the device may include a first clock signal generator operative to provide a first clock signal to a transmitter of a transceiver, where the first clock signal operates at a first frequency. In particular embodiments, the device may further include a second clock signal generator operative to provide a second clock signal to a receiver of the transceiver, where the second clock signal operates at a second frequency, and where the receiver samples an output of the transmitter at a sampling rate determined by the second frequency. In some embodiments, the device may further include a logic circuit operative to receive an output signal from the receiver and further operative to determine an indication of jitter based on the received output signal.

According to various embodiments, the first clock signal generator and the second clock signal generator are operative to generate the first clock signal and the second clock signal based on a single input clock signal, where the first frequency is different from the second frequency. In some embodiments, the second clock signal generator comprises a phase locked loop, where the phase locked loop is operative to receive the first clock signal from the first clock signal generator and is further operative to provide the second clock signal to the receiver of the transceiver. In various embodiments, a voltage applied to the phase locked loop and a multiplier included in the receiver of the transceiver are operative to determine the difference between the first frequency and the second frequency. According to particular embodiments, the logic circuit is further operative to determine the indication of jitter by counting a number of data values included in the output signal and dividing the number by a total number of data values included in the output signal. In some embodiments, the logic circuit is further operative to determine the indication of jitter by counting the number of consecutive clock cycles in a transition period, where the transition period is a period of time in which the output signal transitions from a first state to a second state. According to various embodiments, the logic circuit comprises a counter, where the counter is a state machine operative to be triggered by a change in the output signal. In particular embodiments, the logic circuit is further operative to determine a timing measurement based on the output signal. In some embodiments, the second clock signal generator and the logic circuit are included in the transceiver.

In another aspect, a method may provide a first clock signal to a transmitter of a transceiver, where the first clock signal operates at a first frequency. According to various embodiments, the method may provide a second clock signal to a receiver of the transceiver, where the second clock signal operates at a second frequency, and where the receiver samples an output of the transmitter at a sampling rate determined by the second frequency. In particular embodiments, the method may receive an output signal from the receiver. According to particular embodiments, the method may determine an indication of jitter based on the received output signal.

According to various embodiments, the method further comprises generating the first clock signal and the second clock signal based on a single input clock signal, where the first frequency is different from the second frequency. In some embodiments, the second clock signal is generated by a phase locked loop, where the phase locked loop receives the first clock signal from a first clock signal generator and provides the second clock signal to the receiver of the transceiver. In some embodiments, the difference between the first frequency and the second frequency is determined based on a voltage applied to the phase locked loop and a multiplier included in the receiver of the transceiver. In particular embodiments, the method further comprises counting a number of data values included in the output signal, and dividing the number by a total number of data values included in the output signal. According to various embodiments, the method further comprises counting the number of consecutive clock cycles in a transition period, where the transition period is a period of time in which the output signal transitions from a first state to a second state.

In another aspect, a non-transitory computer readable storage medium may have computer code embodied therein, the computer readable storage medium comprising computer code for providing a first clock signal to a transmitter of a transceiver, where the first clock signal operates at a first frequency. In various embodiments, the non-transitory computer readable storage medium may further comprise computer code for providing a second clock signal to a receiver of the transceiver, where the second clock signal operates at a second frequency, and where the receiver samples an output of the transmitter at a sampling rate determined by the second frequency. In some embodiments, the non-transitory computer readable storage medium may further comprise computer code for receiving an output signal from the receiver. In particular embodiments, the non-transitory computer readable storage medium may further comprise computer code for determining an indication of jitter based on the received output signal.

According to various embodiments, the non-transitory computer readable storage medium may further comprise computer code for generating the first clock signal and the second clock signal based on a single input clock signal, where the first frequency is different from the second frequency. In some embodiments, the difference between the first frequency and the second frequency is determined based on a voltage applied to a phase locked loop and a multiplier included in the receiver of the transceiver. In various embodiments, the non-transitory computer readable storage medium may further comprise computer code for counting a number of data values included in the output signal. According to some embodiments, the non-transitory computer readable storage medium may further comprise computer code for dividing the number by a total number of data values included in the output signal. In particular embodiments, the non-transitory computer readable storage medium may further comprise computer code for counting the number of consecutive clock cycles in a transition period, where the transition period is a period of time in which the output signal transitions from a first state to a second state.

DESCRIPTION OF PARTICULAR EMBODIMENTS

Figure 1:
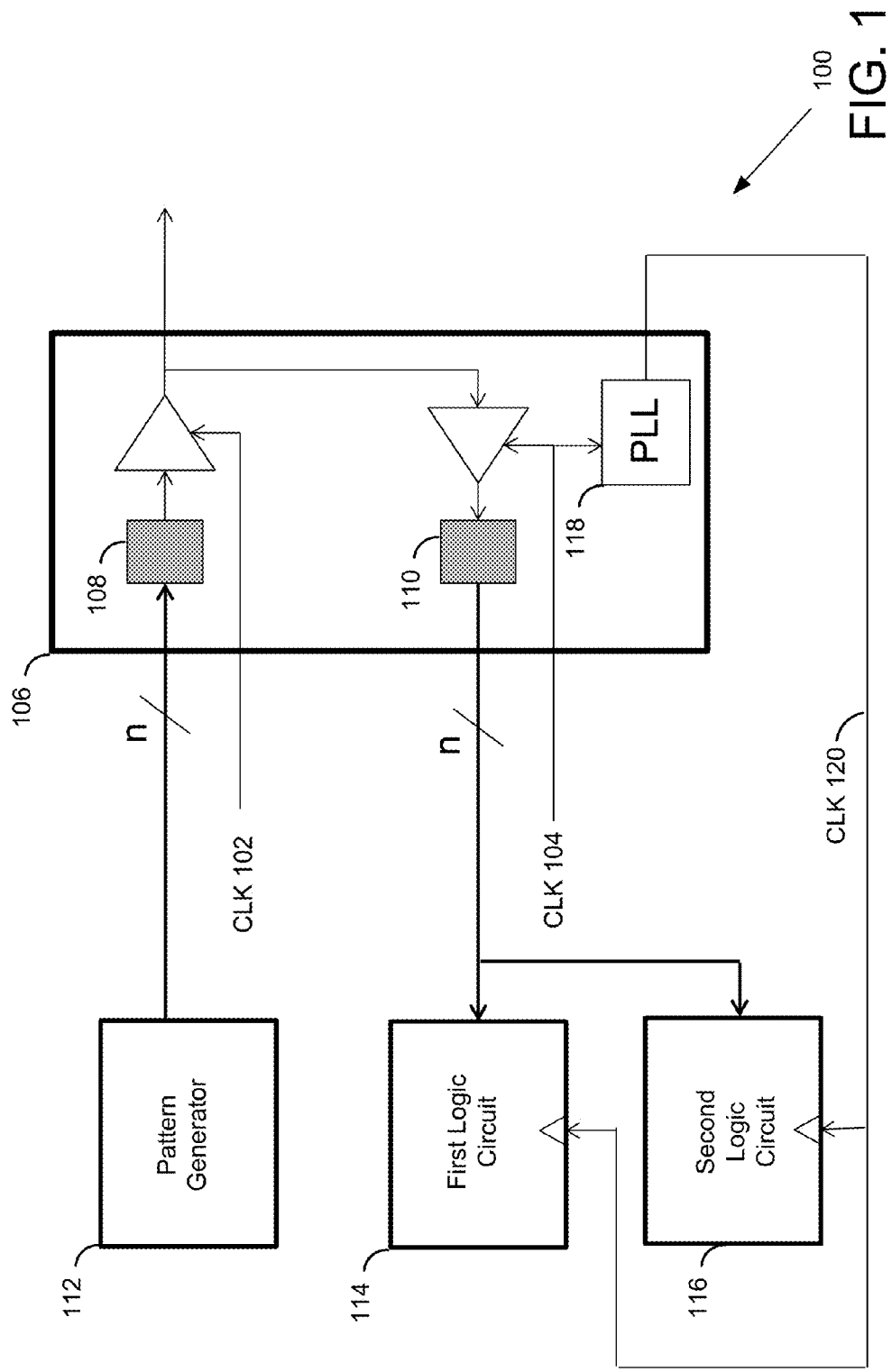
FIG. 1 illustrates an exemplary circuit for measuring a timing characteristic such as jitter, implemented in accordance with some embodiments.

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a mechanism unless noted otherwise. For example, a system may use a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to a memory component, but it will be appreciated that a variety of bridges and controllers may reside between the processor and memory. Consequently, a connection does not necessarily mean a direct, unimpeded connection unless otherwise noted.

In various embodiments, a circuit may be configured to measure a timing characteristic of a device, such as a transceiver. The circuit may be configured to provide a first clock signal having a first frequency to a transmitter of the transceiver. The circuit may be further configured to provide a second clock signal having a second frequency to a receiver of the transceiver. According to various embodiments, the transmitter and receiver may be coupled in serial loopback mode. Thus, an output of the transmitter may be coupled with an input of the receiver. Accordingly, the receiver may sample the output of the transmitter at the second frequency. In various embodiments, the second frequency varies from the first frequency by a few parts per million. For example, the first frequency may be 125 MHz while the second frequency may be 125.2 MHz. Because the first frequency used to drive the transmitter is slightly different than the second frequency used to drive the receiver, the receiver samples the output of the transmitter at a different time during each clock cycle. Thus, the difference between the frequency at which the transmitter operates and the frequency at which the receiver samples the output of the transmitter results in a sampling pattern that sweeps from one end of a clock cycle to the other end. In various embodiments, the data values read by the receiver at the different sampling points may be used to determine a timing measurement or a measurement of jitter. For example, values sampled at different times during a clock cycle may be used to determine how much the timing of a transitional edge varies during successive clock cycles. Moreover, values sampled at different times during a clock cycle may be used to determine to what extent the transceiver distorts a duty cycle of an input signal.

In particular embodiments, the circuit may be included in soft logic, such as a programmable logic device, or hard logic, such as an ASIC. Thus, according to various embodiments, the circuit is included in the device. For example, the circuit may be included in a transceiver. In this example, the transceiver may include a programmable logic region. The circuit may be implemented within the programmable logic region. The programmable logic region may be provided with one or more clock signals which may be used to obtain a timing measurement and a measurement of jitter for the transceiver. In various embodiments, the one or more clock signals may be provided by external testing equipment that includes one or more clock signal generators. Thus, during a production process, the transceiver may be provided with one or more clock signals and use the circuit implemented within the programmable logic region to obtain measurements within milliseconds.

According to various embodiments, the circuit may be included in hard or soft logic that is external to the device. For example, the circuit may be implemented in a programmable logic device (PLD) that is external to a transceiver. The programmable logic device may be coupled to the transceiver and provided with one or more clock signals. The programmable logic device may use the one or more clock signals to determine a timing measurement and a measurement of jitter for the transceiver. During a production process, the programmable logic device may be coupled to a transceiver and may obtain a timing measurement and a jitter measurement for the transceiver within milliseconds.

FIG. 1 illustrates an exemplary circuit for measuring a timing characteristic such as jitter, implemented in accordance with some embodiments. In various embodiments, circuit 100 may include first clock signal 102, second clock signal 104, transceiver 106, transmitter 108, receiver 110, pattern generator 112, first logic circuit 114, second logic circuit 116, phased locked loop (PLL) circuit 118, and third clock signal 120. According to various embodiments, transceiver 106 may exhibit jitter, such as oscillation in timing or a drift in its response to an input clock. This may be due to one or more of several factors such as hardware imperfections, temperature variations, and other ambient conditions. Thus, circuit 100 may be utilized to determine a measurement of jitter for transceiver 106.

In various embodiments, transceiver 106 may include transmitter 108 and receiver 110. Transmitter 108 may include a first multiplier, a first buffer, a first input port and a first output port. In various embodiments, transmitter 108 may transmit a signal that is driven by first clock signal 102. In particular embodiments, the signal may be generated by pattern generator 112. Receiver 110 may include a second multiplier, a second buffer, a second input port, and a second output port. In various embodiments, receiver 110 may receive an input signal at the second input port and provide an output signal from the second output port that is driven by second clock signal 104. In circuit 100, transceiver 106 is configured to be in serial loopback mode. Thus, the first output port of transmitter 108 is coupled to the second input port of receiver 110. Accordingly, a pattern generated by pattern generator 112 may be provided as an input to transmitter 108, looped back to receiver 110, and provided as an output of receiver 110.

In various embodiments first clock signal 102 and second clock signal 104 are closely correlated clock signals. According to particular embodiments, clock signals may be closely correlated when they share the same drift and other temporal imperfections inherent in a clock signal generator. Thus, according to various embodiments, closely correlated clock signals are not independent clock signals. In some embodiments, the clock signals may be generated by different clock signal generators that may be adjusted individually. While the closely correlated clock signals may share the same drift and temporal characteristics, they may operate at different frequencies. Thus, first clock signal 102 and second clock signal 104 may share the same temporal characteristics (such as drift). However, first clock signal 102 may operate at a first frequency while second clock signal 104 operates at a second frequency. In various embodiments, the difference between the first frequency and the second frequency may be relatively small, such as a few parts per million. For example, the first frequency may be 125 MHz while the second frequency is 125.2 MHz.

Figure 4A:
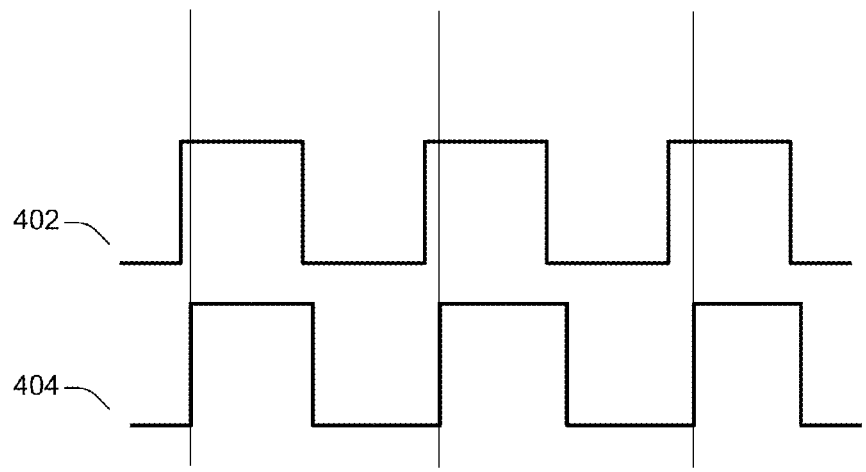
FIG. 4A illustrates an exemplary timing diagram of a first clock signal and a second clock signal, implemented in accordance with some embodiments.

FIG. 4A illustrates an exemplary timing diagram of a first clock signal and a second clock signal, implemented in accordance with some embodiments. As previously discussed, first clock signal 102 and second clock signal 104 operate at slightly different frequencies. Thus, the rising edge of second clock signal 104 coincides with a different portion of first clock signal 102 during each clock cycle. Accordingly, the rising edges of the two clock signals diverge due to the difference between the first and second frequencies.

Returning to FIG. 1, first clock signal 102 is used to drive transmitter 108 while second clock signal 104 is used to drive receiver 110. Because the clock signals operate at different frequencies and because transmitter 108 and receiver 110 are configured in serial loopback mode, receiver 110 samples the output of transmitter 108 at a different frequency than the frequency at which transmitter 108 provides the output. For example, transmitter 108 may be driven by first clock signal 102 and provide an output at a first frequency of 125 MHz. However, receiver 110 samples the output of transmitter 108 at a second frequency of 125.2 MHz. Because receiver 110 is sampling the output of transmitter 108 at a slightly faster frequency, the temporal position in a particular clock cycle at which the output of transmitter 108 is sampled will change. As previously discussed and illustrated in FIG. 4A, the rising edge of second clock signal 104 coincides with different temporal positions of the waveform of first clock signal 102 thus causing receiver 110 to sample the output of transmitter 108 at different times within a clock cycle.

Figure 4B:
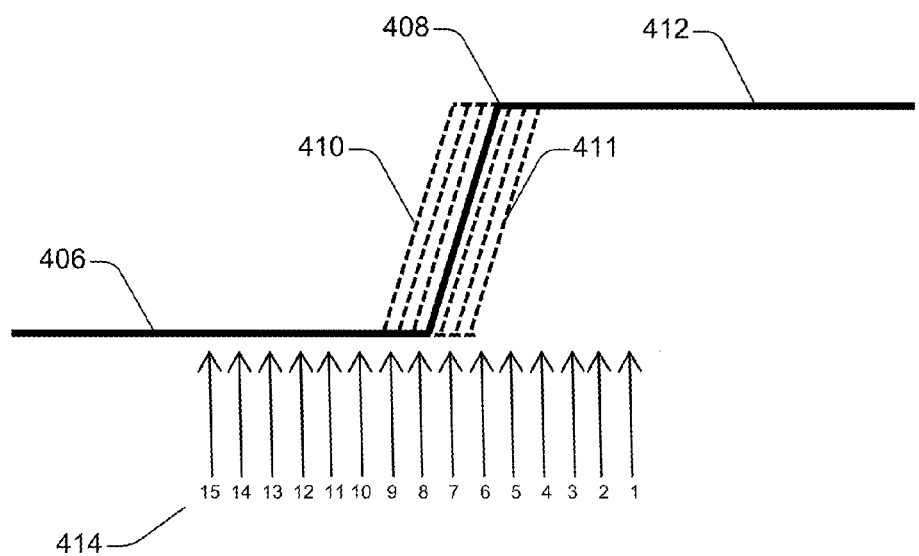
FIG. 4B illustrates an exemplary diagram of different sampling points of a transitional edge over several clock cycles, implemented in accordance with some embodiments.

FIG. 4B illustrates an exemplary diagram of different sampling points of a transitional edge over several clock cycles, implemented in accordance with some embodiments. In various embodiments, a transitional edge of an output of a transmitter included in a transceiver may be an edge created by a transition from a low value, such as zero, to a high value, such as one. In this instance, the portion of the clock cycle where the output of the transmitter has a low value is represented by portion 406. The portion of the clock cycle where the output of the transmitter has a high value is represented by portion 412. The transitional edge between the low value and the high value is represented by portion 408. Because of hardware imperfections and ambient conditions, the temporal position of the transitional edge within the clock cycle may vary from the ideal temporal position of the edge. For example, in a first clock cycle in which there is a low-to-high transition, the transitional edge may occur in the middle of the clock cycle, as shown by portion 408. However, in a second clock cycle, the transitional edge may occur at a different time within the clock cycle, such as temporal position 410. Furthermore, in a third clock cycle, the transitional edge may occur at another time within the clock cycle, such as temporal position 411. Thus, the time at which the transitional edge occurs within a clock cycle may vary within a range of the ideal edge. In this instance, the transitional edge drifts from temporal position 410 to temporal position 411.

The receiver of the transceiver will sample the output of the transmitter at each clock cycle. Because the transmitter and receiver are driven by clocks at different frequencies, the receiver will sample the output of the transmitter at a different time during each clock cycle. Thus, the receiver may sample the output of the transmitter according to a sampling pattern depicted by sampling pattern 414. For example, during a first clock period, the receiver may sample the output of the transmitter at a first sampling point shown by the arrow enumerated "1". During a second clock period, the receiver may sample the output of the transmitter at a second sampling point shown by the arrow enumerated "2". At each of these sampling points, the receiver will read a value of "1" because the output of the transmitter is in portion 412 which is a high state. However, by fifth or sixth sampling point, the receiver will be sampling the transitional edge.

Because the temporal position of the transitional edge changes from clock cycle to clock cycle due to jitter, the value read by the receiver may change between a one and a zero. For example, during a sixth clock cycle, the receiver may sample the output of the transmitter at a sixth sampling point shown by the arrow enumerated "6". If the transitional edge during the sixth clock cycle occurs at temporal position 410, the receiver will read a value of "1". During a seventh clock cycle, the receiver may sample the output of the transmitter at a seventh sampling point shown by the arrow enumerated "7". If the transitional edge during the seventh clock cycle drifts and now occurs at temporal position 411, the receiver will read a value of "0". During an eighth clock cycle, the receiver may sample the output of the transmitter at an eighth sampling point shown by the arrow enumerated "8". If the transitional edge during the eighth clock cycle drifts and again occurs at temporal position 410, the receiver will read a value of "1". Thus, for the sixth through eighth clock cycles, the receiver will read values and output of "101". Once the tenth sampling point is reached, the value read by the receiver will stabilize at a value of "0". Thus, the receiver may generate an output with values such as " . . . 111111111111101001010110000000000000 . . . " The period in which the value oscillates between a "0" and a "1" may be referred to as a transition region. The width of the transition region may identify the number of clock cycles during which a transitional edge was detected. The number of clock cycles may be used to determine a temporal measure of the peak-to-peak jitter of the transceiver based on the operational frequency of the second clock signal used to drive the receiver.

Returning to FIG. 1, according to various embodiments, an output of receiver 110 may be coupled to first logic circuit 114 and second logic circuit 116. In various embodiments, a logic circuit may be implemented as hard or soft logic. In particular embodiments, a logic circuit may be configured to analyze the output of receiver 110 to determine one or more measurements of timing characteristics of transceiver 106. For example, a logic circuit may measure duty cycle distortion and total jitter.

In various embodiments, duty cycle distortion may be a temporal deviation in the amount of time a signal is asserted and the amount of time a signal is not asserted within a period of time. For example, an input signal generated by pattern generator 112 and provided to transmitter 108 may have a duty cycle of 50%. Thus, the input signal may alternate between ones and zeros and spend half of a clock cycle at a value of one while spending the other half of the clock cycle at a value of zero. The ratio obtained at the output of receiver 110 may be distorted due to delays in low-to-high or high-to-low transitions. Thus, the ratio between time spent at a value of 1 and time spent at a value of 0 may be 0.55. For example, if first logic circuit 114 is configured to measure duty cycle distortion, first logic circuit 114 may include a combination of counters and adders which count the number of high values and low values in a signal. After a designated period of time in which first logic circuit 114 monitors the output signal of receiver 110, first logic circuit 114 may be configured to provide an output which identifies a ratio of high values to a total number of values. For example, the output may identify the number of high values and the total number of clock cycles. If the pattern input to transceiver 106 is a balanced input (half ones and half zeros), the ratio obtained by dividing the number of high values by the total number of clock cycles may be compared to a value of 0.5 to determine how much duty cycle distortion has occurred. In various embodiments, the ratio may be compared with a designated critical value to determine whether or not the device exhibits an acceptable amount of duty cycle distortion.

In various embodiments, total jitter may be peak-to-peak jitter. Thus total jitter may be a measure of how much a transitional edge of the output of receiver 110 drifts from an ideal edge. If second logic circuit 116 is configured to measure total jitter, second logic circuit 116 may be configured as a state machine that counts the total number of clock cycles spent in a particular state. The state machine may be triggered by a change in an input value which may occur upon entry into a transition region. For example, an output of receiver 110 may be coupled to an input of second logic circuit 116. An input pattern of alternating ones and zeros may be provided to an input of transmitter 108. As discussed above with reference to FIG. 4B, the output of receiver 110 will be one state (in this example all ones) until the transition region is reached in which the output of receiver 110 will oscillate between ones and zeros due to the variation in the position of the transitional edge. Once the transition region is reached, a state machine in second logic circuit 116 may be configured to begin counting a number of clock cycles. Once the signal stabilizes at a value of zero, the state machine may be configured to stop counting. The number of clock cycles counted by the state machine may be reported at an output of second logic circuit 116 as a measure of total jitter. As previously discussed with reference to FIG. 4B, the operational frequency of the second clock signal used to drive the receiver and the number of clock cycles may be used to determine a temporal measure of the peak-to-peak jitter of the transceiver.

In various embodiments, second clock signal 104 may be coupled to PLL 118 to generate third clock signal 120. Third clock signal 120 may be used to drive first logic circuit 114 and second logic circuit 116 at a frequency that is the same as and synchronous with an output of receiver 118. While two logic circuits are shown, any number of logic circuits may be coupled to receiver 110 to perform any number of measurements.

Figure 2:
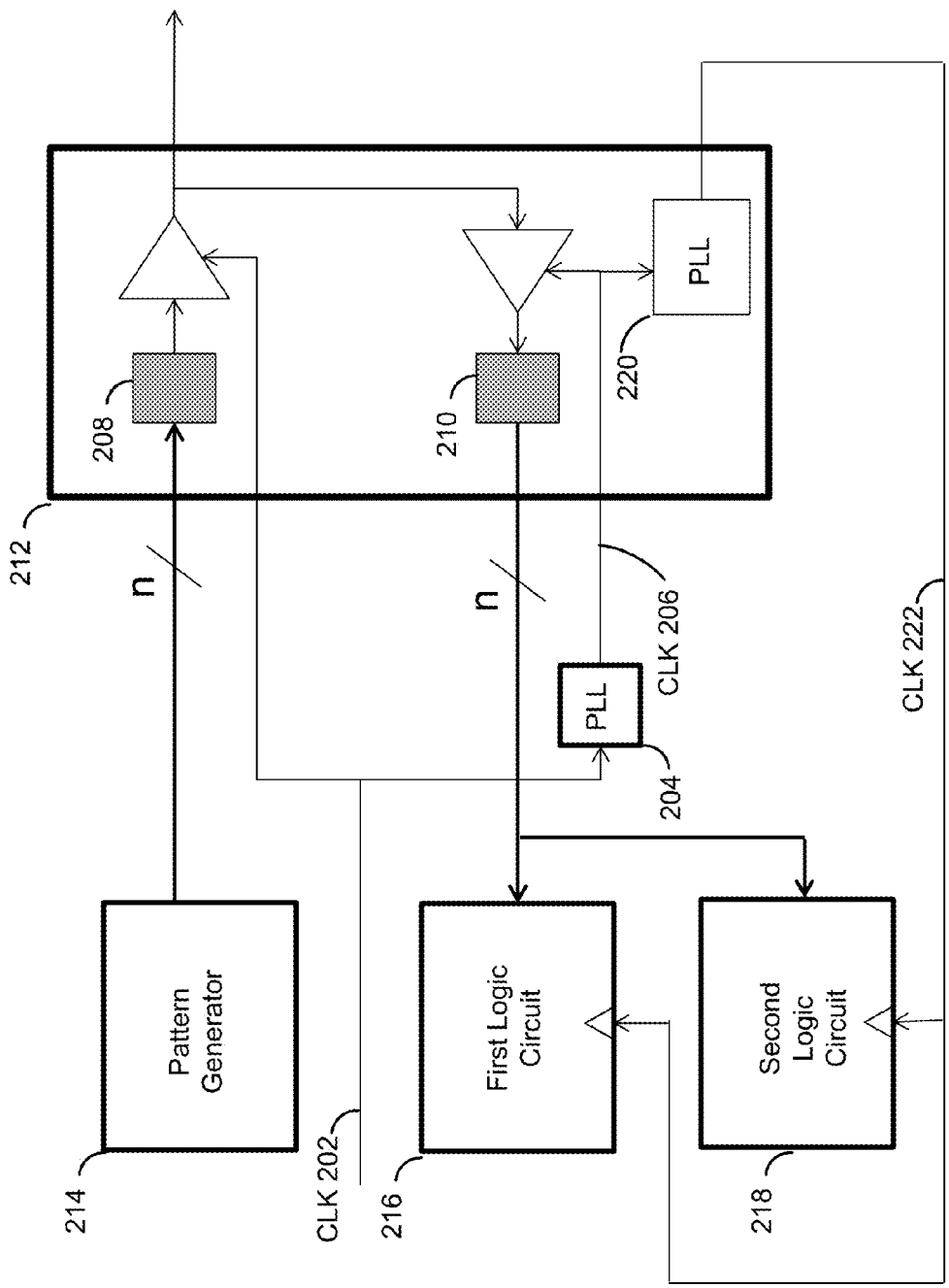
FIG. 2 illustrates another exemplary circuit for measuring a timing characteristic such as jitter, implemented in accordance with some embodiments.

FIG. 2 illustrates another exemplary circuit for measuring a timing characteristic such as jitter, implemented in accordance with some embodiments. In various embodiments, circuit 200 may include first clock signal 202, first phased locked loop (PLL) circuit 204, second clock signal 206, transmitter 208, receiver 210, transceiver 212, pattern generator 214, first logic circuit 216, second logic circuit 218, second phased locked loop (PLL) circuit 220, and third clock signal 222. According to various embodiments, pattern generator 214, first logic circuit 216, second logic circuit 218, second phased locked loop (PLL) circuit 220, and third clock signal 222 operate as previously described in FIG. 1 with reference to pattern generator 112, first logic circuit 114, second logic circuit 116, phased locked loop (PLL) circuit 118, and third clock signal 120.

In various embodiments the clock signals used to drive transmitter 208 and receiver 210 may be generated based on the same clock signal. Thus, a single clock source, such as a single reference clock, may be used to generate first clock signal 202 for transmitter 208 and second clock signal 206 for receiver 210. In some embodiments, a first clock signal 202 may be coupled to transmitter 208 and PLL 204. PLL 204 may be used to generate second clock signal 206 which is coupled to receiver 210. In various embodiments, PLL 204 may be configured to introduce a change in the frequency of first clock signal 202. In some embodiments, the change may be relatively small. For example, the change may be 2 parts per million. Thus, first clock signal 202 may operate at a first frequency while second clock signal 204 operates at a second frequency.

In some embodiments, PLL 204 might not be capable of producing a change in frequency as small as 2 parts per million. In this instance, PLL 204 may be configured to produce a change in frequency, and frequency multipliers within the transmitter and the receiver may be set according to a specified ratio to compensate. The ratio is chosen such that the ppm difference is small enough for the test purposes, but not so small that the intrinsic variability in the clock source might affect the measured results. Configurable counters in the PLL IP may be set through configuration bits to achieve the desired ratio. For example, an input clock signal may have an operational frequency of 125 MHz. On a first path, the input clock signal may go through a PLL having a 50× frequency multiplier which multiplies first clock signal to a first frequency of 6.25 GHz. In this example, PLL 204 might not be able to produce a change in frequency in the order of several parts per million. In this example, PLL 204 may be set to produce a change in frequency at a ratio of 25/16, and a frequency multiplier in receiver 210 may be set to 32× to multiply second clock signal to a second frequency of 6.29 GHz. In another example, the input clock signal, such as first clock signal 202, may have an operational frequency of 125 MHz. One clock signal path goes through a PLL of effective ratio 50, thus producing a first frequency of: 125 MHz*50=6.25 GHz. On the other path, the reference clock goes through two PLLs, of ratios 32 and 164/105, thus producing a second frequency of: 125 MHz*(164/105)*32=6.24762 GHz. This produces a difference of about 381 ppm ((6.25e9−6.24762e9)/6.25e9)*1e6=380.8).

Thus, according to various embodiments, frequency multipliers included in transmitter 208 and receiver 210 may be adjusted to generate a relatively small frequency difference between first clock signal 202 and second clock signal 206.

Figure 3:
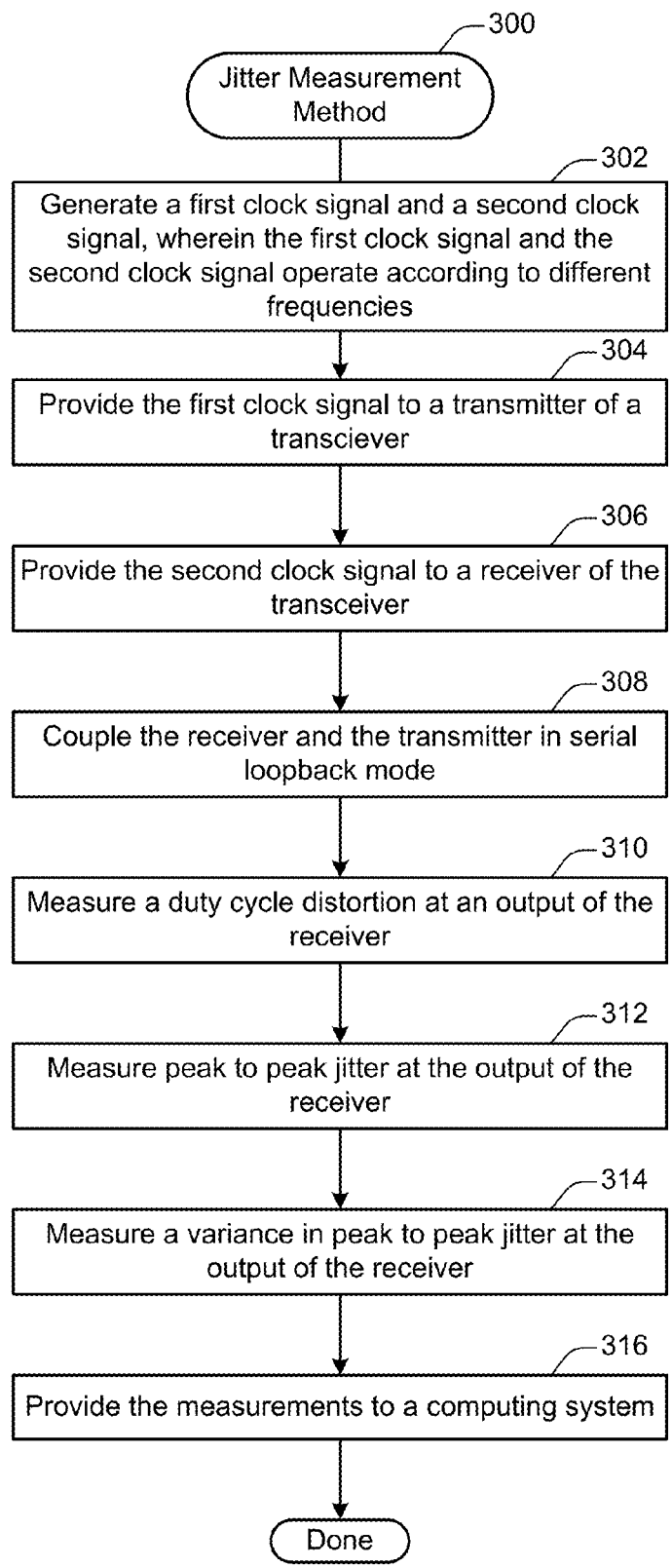
FIG. 3 illustrates an exemplary method for measuring a timing characteristic such as jitter, implemented in accordance with some embodiments.

FIG. 3 illustrates an exemplary method for measuring a timing characteristic such as jitter, implemented in accordance with some embodiments. At step 302, a first clock signal and a second clock signal may be generated. In various embodiments, the first clock signal and the second clock signal may be closely correlated clock signals that operate at slightly different frequencies. As previously discussed with reference to FIG. 1 and FIG. 2, the first clock signal and the second clock signal may be generated based on two different clock sources, or based on a single clock source by using a PLL and a configuration of frequency multipliers.

At step 304, the first clock signal may be provided to a transmitter of a transceiver. In various embodiments, the transmitter may also be coupled to a pattern generator capable of providing an input pattern of data values. At step 306, the second clock signal may be provided to a receiver of the transmitter. At step 308, an output of the transmitter may be coupled to an input of the receiver to configure the transceiver in serial loopback mode.

At step 310, a duty cycle distortion may be measured based on an output of the receiver of the transceiver. In various embodiments, the pattern generator may provide the transmitter a signal of alternating values. Thus, the input to the transmitter may comprise a stream of values such as "1010101010 . . . " for a designated period of time (i.e. a predetermined number of clock cycles). In various embodiments, the designated period of time may be determined by a designer to obtain a statistically significant data sample. For example, the designated period of time may be 10000000 clock cycles. The logic circuit may monitor the output of the receiver for the designated period of time, count the number of zeroes in the data, and count the number of ones in the data. In various embodiments, the logic circuit may provide the number of ones as an output to a computer system. The computer system may divide the number of ones by the total number of clock cycles to determine a duty cycle of the transceiver. In various embodiments, the determined duty cycle may be compared to a predetermined reference value or a critical value to determine whether or not the transceiver exhibits an acceptable amount of duty cycle distortion.

At step 312, a peak-to-peak jitter may be measured based on the output of the receiver of the transceiver. As similarly discussed with reference to FIG. 4B, a second logic circuit may include a state machine that identifies a first portion of a clock cycle having a first stable value. For example, in a low-to-high transition, the first stable value may be a value of "0". The state machine may then identify a transition region in which a transitional edge is detected. The state machine may count the number of clock cycles spent in the transition region. The state machine may then identify a second portion of a clock cycle having a second stable value. In the example of the low-to-high transition, the second stable value may be a value of "1". In response to identifying the second portion, the state machine may stop counting clock cycles. The second logic circuit may provide the number of clock cycles counted by the state machine as an output to the computer system. As discussed previously with reference to FIG. 4B, the number of clock cycles may be used to determine how far the transitional edge drifts from the ideal edge. In various embodiments, the second logic circuit may be configured to measure the peak-to-peak jitter for multiple different transitions and further configured to record the maximum value. Thus, the peak-to-peak jitter may be measured for multiple low-to-high and high-to-low transitions and the maximum measured value may be provided as an output to the computer system.

At step 314, a timing measurement, such as a variance in peak-to-peak jitter, may be measured at the output of the receiver. In some embodiments a third logic circuit may be configured similarly to the second logic circuit, and may measure peak-to-peak jitter multiple times for multiple transitions. However, instead of reporting a maximum value, the third circuit may be configured to determine a variance in the measured values. Thus, the third logic circuit may provide a value that identifies a difference between a minimum and a maximum peak-to-peak jitter of the transceiver.

At step 316, the measurements determined in steps 310, 312, and 314 may be provided to a computer system. In various embodiments, the computer system may be configured to obtain measurements from the logic circuits and store the measurements in a non-transitory computer readable storage medium, such as a non-volatile hard drive.

Figure 5:
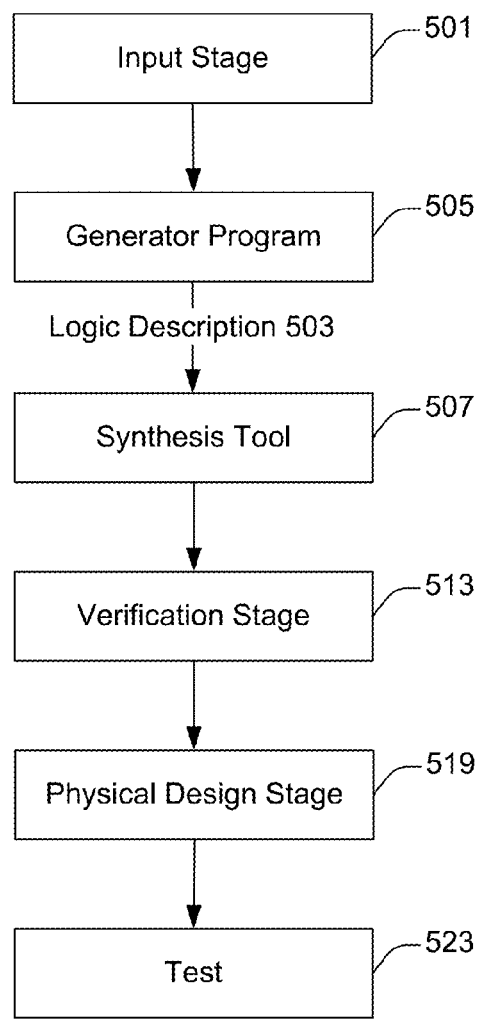
FIG. 5 illustrates an exemplary technique for implementing, on a programmable chip, a circuit for performing a jitter or timing measurement in accordance with some embodiments.

FIG. 5 illustrates an exemplary technique for implementing, on a programmable chip, a circuit for performing a jitter or timing measurement in accordance with some embodiments. Such a technique may be used to implement a programmable logic device (PLD), as discussed above. An input stage 501 receives selection information typically from a user for logic such as a processor core as well as other components to be implemented on an electronic device. In one example, the input received is in the form of a high-level language program. A generator program 505 creates a logic description 503 and provides the logic description along 503 with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of hard coded logic. In some examples, components provided to an input stage include intellectual property functions, megafunctions, and intellectual property cores. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected. At this stage, the user may enter security information about individual components that needs to be isolated. For example, different levels of component security and which components are allowed to communicate with each other may be entered.

In typical embodiments, the generator program 505 can identify the selections and generate a logic description with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. One tool with generator program capabilities is System on a Programmable Chip (SOPC) Builder available from Altera Corporation of San Jose, Calif. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
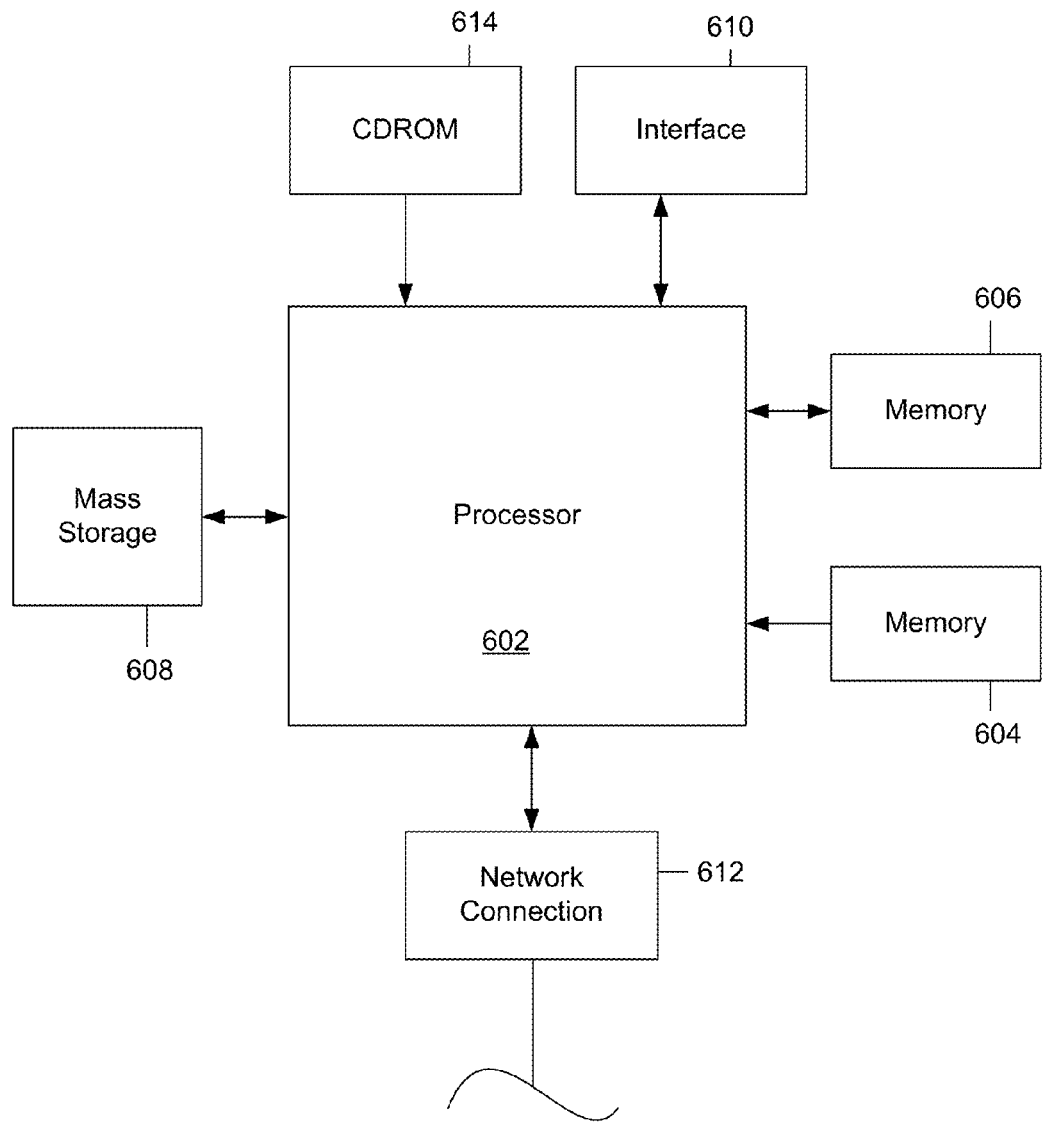
FIG. 6 illustrates one example of a computer system according to some embodiments.

FIG. 6 illustrates one example of a computer system according to some embodiments. The computer system 600 includes any number of processors 602 (also referred to as central processing units, or CPUs) that are coupled to devices including memory component 606 (typically a random access memory, or "RAM"), memory component 604 (typically a read only memory, or "ROM"). The processors 602 can be configured to generate an electronic design. As is well known in the art, memory component 604 acts to transfer data and instructions uni-directionally to the CPU and memory component 606 are used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory component 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 602 may be a design tool processor. Finally, CPU 602 optionally may be coupled to a computer or telecommunications network using a network connection as shown generally at 612. With such a network connection, it is contemplated that the CPU might receive information from the network, or might output information to the network in the course of performing the above-described process steps. It should be noted that the system 600 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An apparatus comprising:
   a first clock signal generator to provide a first clock signal to a transmitter of a transceiver, wherein the first clock signal is to operate at a first frequency;
   a second clock signal generator to provide a second clock signal to a receiver of the transceiver, wherein the second clock signal is to operate at a second frequency, wherein the receiver is to sample an output of the transmitter at a sampling rate determined by the second frequency, and wherein the second clock signal generator is to receive the first clock signal and generate the second clock signal; and
   a logic circuit operative to receive an output signal from the receiver and further to determine an indication of jitter based on the received output signal, wherein the logic circuit is further to determine the indication of jitter by counting the number of consecutive clock cycles in a transition period, wherein the transition period is a period of time in which the output signal transitions from a first state to a second state.

2. The apparatus of claim 1, wherein the second clock signal generator comprises a phase locked loop, wherein the phase locked loop is to receive the first clock signal from the first clock signal generator and is further to provide the second clock signal to the receiver of the transceiver.

3. The apparatus of claim 2, wherein a voltage applied to the phase locked loop and a multiplier included in the receiver of the transceiver are to determine the difference between the first frequency and the second frequency.

4. The apparatus of claim 1, wherein the logic circuit is further to determine the indication of jitter by counting a number of data values included in the output signal and dividing the number by a total number of data values included in the output signal.

5. The apparatus of claim 1, wherein the logic circuit comprises a counter, wherein the counter is a state machine to be triggered by a change in the output signal.

6. The apparatus of claim 1, wherein the logic circuit is further to determine a timing measurement based on the output signal.

7. The apparatus of claim 1, wherein the second clock signal generator and the logic circuit are included in the transceiver.

8. A method comprising:
   providing a first clock signal to a transmitter of a transceiver, wherein the first clock signal operates at a first frequency;
   providing a second clock signal to a receiver of the transceiver, wherein the second clock signal operates at a second frequency, wherein the receiver samples an output of the transmitter at a sampling rate determined by the second frequency, wherein the second clock signal is generated by a clock signal generator, and wherein the clock signal generator is to receive the first clock signal and provide the second clock signal;
   receiving an output signal from the receiver; and
   determining an indication of jitter based on the received output signal, wherein determining the indication of jitter includes counting the number of consecutive clock cycles in a transition period, wherein the transition period is a period of time in which the output signal transitions from a first state to a second state.

9. The method of claim 8, wherein the second clock signal is generated by a phase locked loop, wherein the phase locked loop receives the first clock signal from a first clock signal generator and provides the second clock signal to the receiver of the transceiver.

10. The method of claim 9, wherein the difference between the first frequency and the second frequency is determined based on a voltage applied to the phase locked loop and a multiplier included in the receiver of the transceiver.

11. The method of claim 8 further comprising:
counting a number of data values included in the output signal; and
dividing the number by a total number of data values included in the output signal.

12. A non-transitory computer readable storage medium having computer code embodied therein, the computer readable storage medium comprising:
computer code for providing a first clock signal to a transmitter of a transceiver, wherein the first clock signal operates at a first frequency;
computer code for providing a second clock signal to a receiver of the transceiver, wherein the second clock signal operates at a second frequency, wherein the receiver samples an output of the transmitter at a sampling rate determined by the second frequency, wherein the second clock signal is generated by a clock signal generator, and wherein the clock signal generator receives the first clock signal and provides the second clock signal;
computer code for receiving an output signal from the receiver; and
computer code for determining an indication of jitter based on the received output signal, wherein determining an indication of jitter includes counting the number of consecutive clock cycles in a transition period, wherein the transition period is a period of time in which the output signal transitions from a first state to a second state.

13. The non-transitory computer readable storage medium of claim 12, wherein the difference between the first frequency and the second frequency is determined based on a voltage applied to a phase locked loop and a multiplier included in the receiver of the transceiver.

14. The non-transitory computer readable storage medium of claim 12 further comprising:
computer code for counting a number of data values included in the output signal; and
computer code for dividing the number by a total number of data values included in the output signal.

15. The apparatus of claim 1, wherein the first state corresponds to a first stable value, the second state corresponds to a second stable value, and the transition period corresponds to a period oscillating between the first stable value and the second stable value.

16. The method of claim 8, wherein the first state corresponds to a first stable value, the second state corresponds to a second stable value, and the transition period corresponds to a period oscillating between the first stable value and the second stable value.

17. The non-transitory computer readable storage medium having computer code embodied therein of claim 12, wherein the first state corresponds to a first stable value, the second state corresponds to a second stable value, and the transition period corresponds to a period oscillating between the first stable value and the second stable value.

* * * * *